United States Patent
McChlery

(10) Patent No.: US 11,211,191 B2
(45) Date of Patent: Dec. 28, 2021

(54) TRANSFORMER RADIATOR

(71) Applicant: Craig Robert McChlery, Springs (ZA)

(72) Inventor: Craig Robert McChlery, Springs (ZA)

( * ) Notice: Subject to any disclaimer, the term of this patent is extended or adjusted under 35 U.S.C. 154(b) by 345 days.

(21) Appl. No.: 16/492,070

(22) PCT Filed: Mar. 8, 2018

(86) PCT No.: PCT/IB2018/051500
§ 371 (c)(1),
(2) Date: Sep. 9, 2019

(87) PCT Pub. No.: WO2018/163092
PCT Pub. Date: Sep. 13, 2018

(65) Prior Publication Data
US 2021/0110956 A1 Apr. 15, 2021

(30) Foreign Application Priority Data
Mar. 8, 2017 (ZA) .................... 2017/01694

(51) Int. Cl.
*H01F 27/12* (2006.01)
*F28F 1/18* (2006.01)
*H05K 7/20* (2006.01)

(52) U.S. Cl.
CPC ............... *H01F 27/12* (2013.01); *F28F 1/18* (2013.01); *H05K 7/209* (2013.01); *H05K 7/20927* (2013.01)

(58) Field of Classification Search
CPC .... H01F 27/12; F28F 1/18; F28F 9/02; H05K 7/209; H05K 7/20927; F28D 1/0308; F28D 1/05366
See application file for complete search history.

(56) References Cited

U.S. PATENT DOCUMENTS 1,461,518 A * 7/1923 Dann ............. H01F 27/12
165/104.33

FOREIGN PATENT DOCUMENTS

| CN | 202905376 U | * | 4/2013 |
| CN | 105006339 A | * | 10/2015 |
| CN | 204695916 U | * | 10/2015 |
| DE | 2530260 A1 | | 1/1977 |
| GB | 1 193 619 A | | 6/1970 |
| WO | WO-2015/015369 A1 | | 2/2015 |

OTHER PUBLICATIONS

International Search Report and Written Opinion for International Application No. PCT/IB2018/051500, dated Jun. 14, 2018 (8 pages).
International Preliminary Report on Patentability for International Application No. PCT/IB2018/051500, dated Aug. 19, 2019 (16 pages).

* cited by examiner

Primary Examiner — Emmanuel E Duke
(74) Attorney, Agent, or Firm — Clark & Elbing LLP

(57) ABSTRACT

This invention concerns a transformer radiator. The radiator includes an inlet manifold, an outlet manifold and a heat exchange fin. The find extends between and is connected to the inlet and outlet manifolds. The heat exchange fin defines at least one oil flow passage to convey transformer oil, which, in use, enters the radiator through the inlet manifold, to the outlet manifold. The heat exchange fin is further provided by a single component having a continuously undulating profile and the manifolds extend transversely to the turns of the undulating profile.

10 Claims, 3 Drawing Sheets

TRANSFORMER RADIATOR

BACKGROUND TO THE INVENTION

THIS invention relates to a transformer radiator. In particular, but not exclusively, the invention relates to a radiator for an oil filled electrical transformer.

A transformer radiator is a heat exchanger used to reduce the temperature of cooling oil used in a distribution or power transformer by dispatching heat from the oil to the ambient air.

There are many types of radiators used on oil filled transformers, such as various arrangements of pipes and elliptical tubes, corrugated wall fins and presses steel radiators. The pressed steel radiator commonly used in power transformers comprises pressed steel panels which are placed together and welded around the peripherals to make one element. These single elements are then welded to inlet and outlet manifold pipes. Pressed steel radiators are available in various numbers of cells which are being braced with reinforcing rods for rigidity. The reinforcing is required due to each cell being made up of individual, discreet elements.

One disadvantage of known radiators is their high cost, which is attributable inter alia to the necessity for handling individual panels which need to be aligned and reinforced to stay in position.

Another commonly used type of radiator commonly used with distribution transformers is the Corrugated Fin Radiator in which corrugated fins serve to increase the surface area of the tank wall exposed to ambient atmosphere to dissipate heat from the oil. Although such radiators are relatively inexpensive they have a number of disadvantages. One important disadvantage is that each fin is open along its length and the open side of the combination of fins needs to be welded by the transformer tank manufacturer to the transformer tank wall around the whole rectangular outline, which is difficult and time-consuming, inter alia because of the length of the weld required and the fact that the tank wall is much thicker, e.g. 5 mm, than the steel used in the radiator, typically 1 to 1.2 mm thick. The end result is that such radiators are prone to leakage. This problem is compounded by the fact that it is not possible to pressure test the radiator for leaks prior to installation. It is also not possible to galvanise these radiators due the open end.

It is an object of the invention to provide a radiator that will, at least partially, alleviate the above disadvantages.

It is also an object of the invention to provide a radiator which will be a useful alternative to existing radiators.

SUMMARY OF THE INVENTION

In accordance with a first aspect of the invention there is provided a transformer radiator including:
an inlet manifold;
an outlet manifold; and
a heat exchange fin extending between and connected to the inlet and outlet manifolds, wherein the heat exchange fin defines at least one oil flow passage to convey transformer oil, which, in use, enters the radiator through the inlet manifold, to the outlet manifold, and wherein the heat exchange fin is provided by a single component having a continuously undulating profile and the manifolds extend transversely to the turns of the undulating profile.

The single component of the heat exchange fin may comprise a pair of metal sheet portions sealed to one another peripherally and separated from one another at least at one location inside the periphery so as to form the at least one oil flow passage.

The pair of metal sheet portions may be separate sheets sealed to one another. Alternatively, the pair of metal sheet portions may be portions of a single sheet folded over one another and sealed to one another.

Preferably, the heat exchange fin includes relief formations located in the inner and outermost turns of the fin, wherein the relief formations extend transversely to the manifolds so as to provide the fin with bending resistance and passages for the oil to flow freely.

Each turn of the fin may include an inlet connected to the inlet manifold in a sealed manner and an outlet connected to the outlet manifold in a sealed manner.

Each of the inlet and outlet manifolds may be in the form of a pipe. Alternatively, each of the inlet and outlet manifolds may be manufactured from two half-sections that are connected to one another to form the manifold.

In accordance with a second aspect of the invention there is provided a method of manufacturing a transformer radiator including:
locating two portions of metal sheeting adjacent one another;
sealing the two portions of metal sheeting peripherally to one another;
deforming the metal sheeting to form a heat exchange fin with a continuously undulating profile;
providing internal pressurization between the two portions of metal sheeting to force them apart from one another at least at one location inside the periphery of the joint sheeting thereby to form the at least one oil flow passage;
providing each turn of the heat exchange fin with an inlet opening and an outlet opening;
providing an inlet manifold and an outlet manifold;
connecting the inlets in a sealed manner to openings in the inlet manifold and connecting the outlets in a sealed manner to openings in the outlet manifold.

The two portions of metal sheeting may be in the form of two separate sheets of metal. Alternatively, the two portions of metal sheeting may be in the form of a folded metal sheet.

BRIEF DESCRIPTION OF THE DRAWINGS

The invention will now be described in more detail, by way of example only, with reference to the accompany drawings and illustrations in which.

DESCRIPTION OF THE ILLUSTRATED EMBODIMENT

Figure 1:
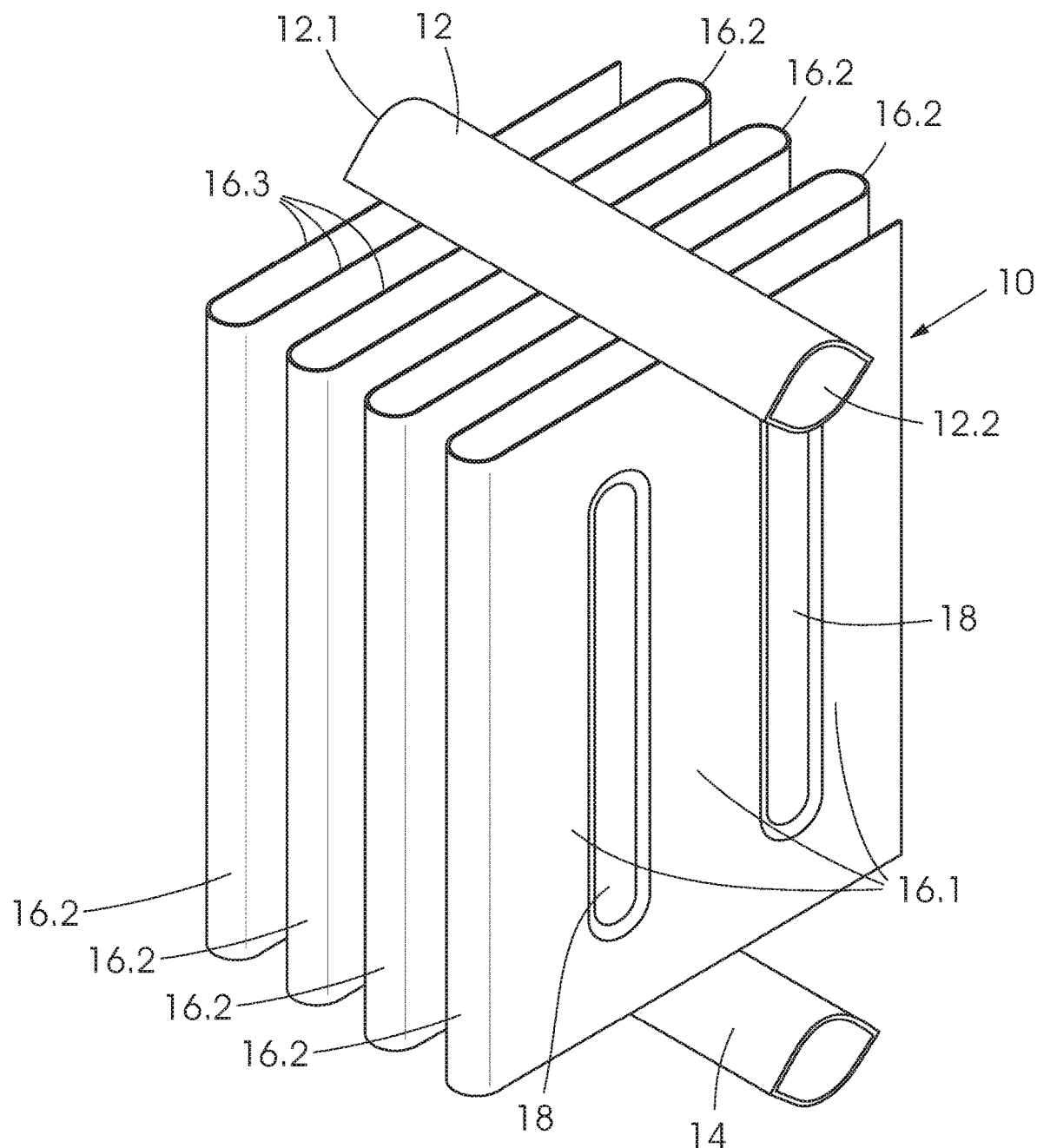
FIG. 1 shows a perspective view of a transformer radiator according to the present invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings and are thus intended to include direct connections between two members without any other members interposed therebetween and indirect connections between members in which one or more other members are interposed therebetween. Further, "connected" and "coupled" are not restricted to physical or mechanical connections or couplings. Additionally, the words "lower", "upper", "upward", "down" and "downward" designate directions in the drawings to which reference is made. The terminology includes the words specifically mentioned above, derivatives thereof, and words or similar import. It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

The transformer radiator 10 seen in the drawings has an upper inlet manifold 12, a lower outlet manifold 14 parallel to the inlet manifold and a heat exchange fin 16 which is connected to and extends between the two manifolds. The heat exchange fin 16 can also be referred to as a cell or element.

The inlet manifold has a closed end 12.1 and an open end 12.2. In use, the open end is connected in a sealed manner to an upper opening in the side wall of a transformer oil tank. The outlet manifold 14, which has a closed end 14.1 and an open end 14.2 and the same cross-sectional shape as the inlet manifold, is connected in a sealed manner to a lower opening in the side wall of the transformer oil tank. In each case, the connection may be made by welding. Alternatively, a flange can be provided on the open end of the manifold through which it can be bolted to the oil tank side wall with a suitable gasket provided to seal the connection.

Figure 2:
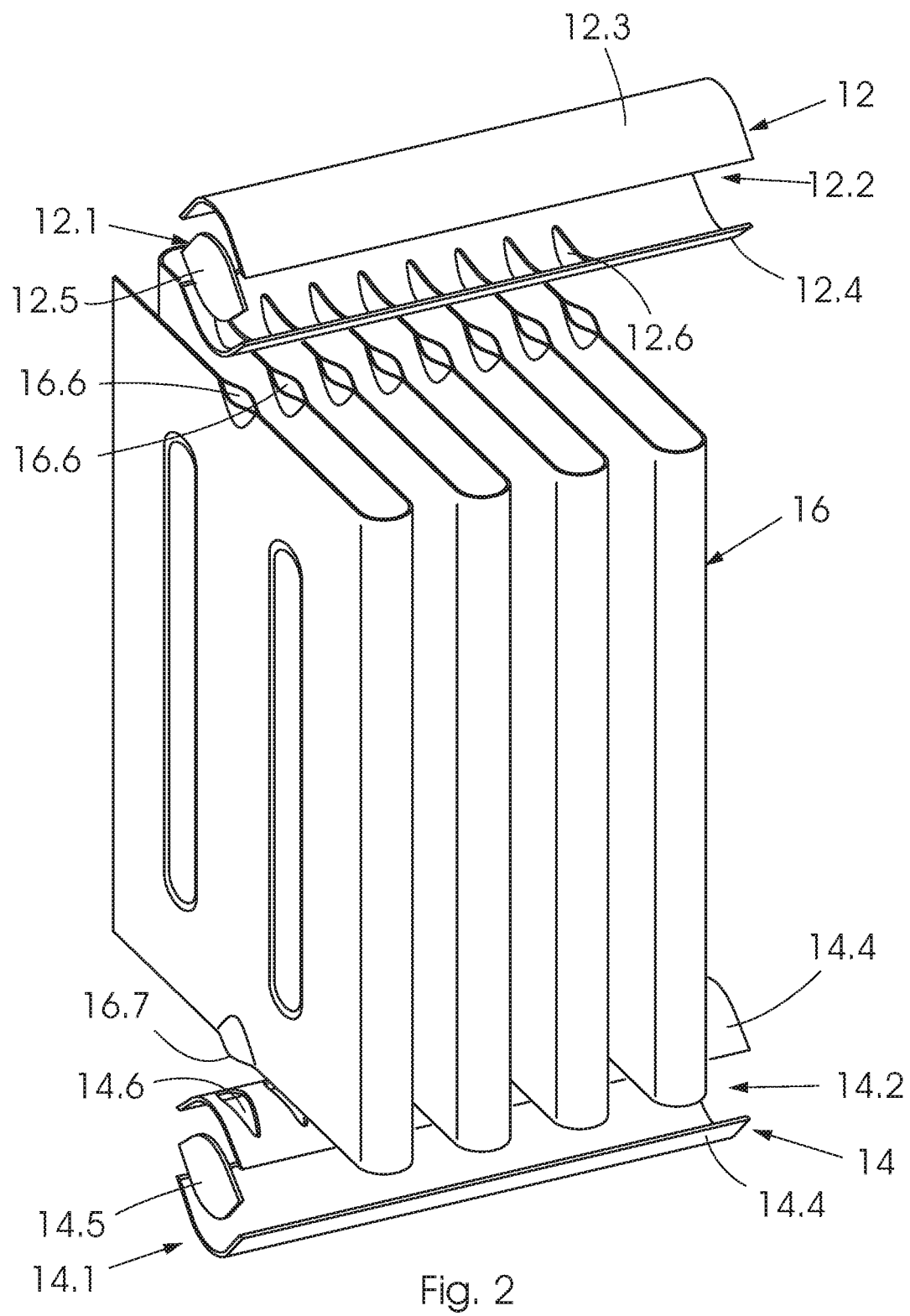
FIG. 2 shows an exploded perspective view of the same transformer radiator.
Figure 3:
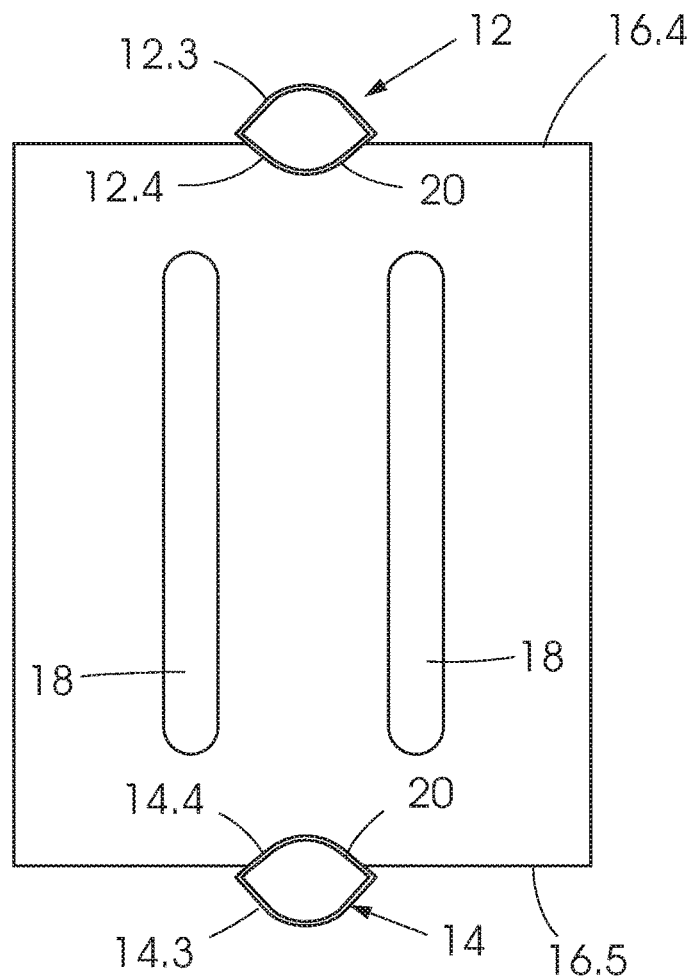
FIG. 3 shows a plan view of the transformer radiator.
Figure 4:
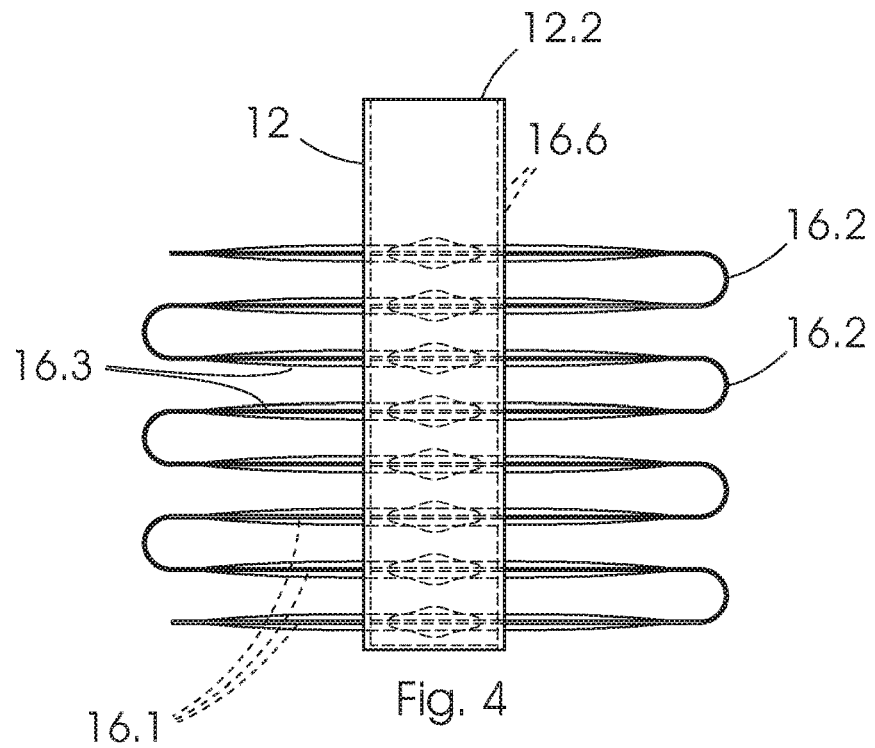
FIG. 4 shows a side view of the transformer radiator.

In the illustrated embodiment the inlet manifold 12 has a generally elliptical cross-sectional shape, which is provided by two mating half-sections 12.3 and 12.4. Similarly, the generally elliptical cross-sectional shape of the outlet manifold 14 is provided by two mating half-sections 14.3 and 14.4. The mating half-sections 12.3, 12.4 and 14.3, 14.4 may be welded or otherwise connected to one another in a sealed manner. The ends 12.1 and 14.1 of the manifolds 12 and 14 are closed by means of blanking inserts 12.5, 14.5 welded or otherwise connected to the manifolds. As shown in FIG. 2, the manifold half-sections are provided with slot-shaped cut-outs 12.6 and 14.6.

Although the inlet 12 and outlet 14 manifolds are illustrated to have an elliptical cross-sectional shape due being manufactured from two separate half-sections, it is envisaged that in an alternative embodiment the inlet 12 and outlet 14 manifolds could have circular cross-sectional shape. In this alternative embodiment the inlet 12 and outlet 14 manifolds could be manufactured from a pipe, for example.

Returning now the illustrated embodiment, the heat exchange fin 16, which provides a plurality of oil flow passages 16.1 between the inlet manifold and the outlet manifold, comprises a single component with a continuously undulating, regular profile formed by alternating bends 16.2 and straight, parallel turns 16.3 between the bends. The fin has an upper edge 16.4 and a lower edge 16.5. As illustrated, the manifolds 12 and 14 extend transversely across, and are connected to, the upper and lower edges 16.4 and 16.5 respectively at positions midway between the bends 16.2, i.e. hallway along the length of each turn 16.3. Although the manifolds 12 and 14 are shown in the accompanying drawings to be substantially midway between the bends 16.2, it should be understood that the manifolds 12 and 14 could be positions anywhere between the bends 16.2. The invention is therefore not limited to any particular position of the manifolds 12 and 14 along the length of each turn 16.3.

The upper and lower edges 16.4 and 16.5 of the fin 16 are formed with inlets 16.6 and outlets 16.7 respectively. The connections between the manifolds and the upper and lower edges of the fin are sealed in nature, with the manifolds communicating with the oil flow passages 16.1 through the inlets 16.6 and outlets 16.7.

The inner and outermost turns 16.3 of the fin 16 include spaced apart, vertical relief formations, in the form of recessed ribs 18, that give these turns structural strength, and bending resistance and creates the passages for the oil to flow freely.

In use, with the illustrated radiator 10 mounted to the oil tank of the transformer, hot oil in the upper part of the oil tank enters the inlet manifold and flows downwardly through the oil flow passages 16.1 to the outlet manifold which conveys the oil back into the oil tank at a lower elevation. The fin is exposed to the ambient atmosphere. During its passage through the fin, the oil is cooled by heat exchange with the ambient air.

When compared to transformer radiators of the known corrugated fin type, the illustrated radiator has the advantage that it can be pressure tested for leaks prior to installation, this being made possible by the sealed nature of the various connections. Another advantage is the relative ease with which it can be connected to the transformer oil tank by means of welded or flanged connections as described above. Further advantages are the aesthetically pleasing appearance created by the continuously undulating fin and the ability to galvanize or otherwise protect the exposed surfaces of the radiator.

When compared to transformer radiators of the known pressed steel type the illustrated radiator has the advantage that it can be mass produced in a cost-effective manner. Also, it has a more aesthetically pleasing appearance and less welded seams created by the continuously undulating fin. The transformer 10 of the present invention also offers improved strength as a result of the continuous, undulating profile and, accordingly, it is not required to add additional reinforcements to improve the structural strength.

It should further be understood that the bends 16.2 do not allow free oil flow through them. Instead, from a functional perspective, they increase the surface area viable for heat dissipation in comparison to known radiators that include discreet elements.

It is envisaged that the illustrated radiator 10 can be manufactured in various different ways. A currently preferred manufacturing method involves the following steps:

i) As an initial step in the manufacture of the heat exchange fin 16, two rectangular sheets of 1 mm thick mild steel are peripherally welded to one another to form a single component with a continuous, peripheral seal. Alternatively, instead of starting with two separate sheets of steel, a single sheet can be folded so at to create two portions of steel sheeting folded over each other. The edges of the folded portions are then welded to one another to form a single component with a continuous, peripheral seal. The advantage of starting with a single sheet of metal and folding it prior to welding the edges together is that the number of welds requires is reduced from four to three.

ii) Curved notches 20 are formed in opposite edges of the component. The size of the notches is such that they cross the welded seam between the sheets.

iii) Using suitable pressing and forming equipment, the component is formed to a continuous, undulating shape.

iv) The component is then placed in a jig which has shaped die inserts that locate between the individual turns of the shape.

v) The manifold half-sections 12.4 and 14.4 are welded to the upper and lower edges 16.4, 16.5 with the notched regions of the edges received in the openings 12.6, 14.6. In the embodiment in which the manifolds 12 and 14 are in the form of pipes, the pipes are simply welded to the upper and lower edges 16.4, 16.5 with the notched regions of the edges received in the openings 12.6, 14.6.

vi) The openings created in the undulating component by the notches 20 are at this stage located within the half-sections 12.4, 14.4 (or alternatively the inlet 12 and outlet 14 manifolds when pipes are used instead of half-sections). Using a suitable flaring tool these openings are then flared open to create the flared inlet and outlet shapes, seen in FIG. 2, which fit closely in the openings 12.6, 14.6. The inlets and outlets are sealed with respect to the openings 12.6, 14.6 by means of continuous welds.

vii) Optionally when using manifold half-section, the manifold half sections 12.3 and 14.3 are fixed in sealed manner to the manifold half-sections 12.4 and 14.4 and the blanking inserts 12.5, 14.5 are sealed to the relevant ends of the manifolds. In the embodiment where pipes are used for the inlet 12 and outlet 14 manifolds, the blanking inserts 12.5, 14.5 (being circular in shape) are sealed to the relevant ends of the manifolds.

viii) The open outlet end 14.2 of the outlet manifold is temporarily sealed closed and fluid, typically compressed air or hydraulic fluid, is introduced into the open inlet end 12.2 of the inlet manifold. The pressure between the steel sheets making up the undulating component forces the sheets apart from one another such that they take the shape of the die inserts located between the turns of the profile and create the oil flow passages 16.1 as well as the ribs 18.

ix) The radiator may also be pressure tested for leaks.

x) Thereafter, the outlet end 14.2 of the outlet manifold is re-opened to produce the final radiator which, if required, can be provided with a suitable anti-corrosion surface treatment, for example galvanizing or painting.

It will be appreciated that the above only provides a couple of embodiments of the invention and that there may be many variations without departing from the spirit and/or the scope of the invention. It is easily understood from the present application that the particular features of the present invention, as generally described and illustrated in the figures, can be arranged and designed according to a wide variety of different configurations. In this way, the description of the present invention and the related figures are not provided to limit the scope of the invention but simply represent selected embodiments.

The skilled person will understand that the technical characteristics of a given embodiment can in fact be combined with characteristics of another embodiment, unless otherwise expressed or it is evident that these characteristics are incompatible. Also, the technical characteristics described in a given embodiment can be isolated from the other characteristics of this embodiment unless otherwise expressed.

The invention claimed is:

1. A transformer radiator including:
an inlet manifold;
an outlet manifold; and
a heat exchange fin extending between and connected to the inlet and outlet manifolds, wherein the heat exchange fin defines at least one oil flow passage to convey transformer oil, which, in use, enters the radiator through the inlet manifold, to the outlet manifold, and wherein the heat exchange fin is provided by a single component having a continuously undulating profile formed by alternating bends and straight, parallel turns between the bends, and wherein the manifolds extend transversely to the turns of the undulating profile;
wherein the single component of the heat exchange fin comprises a pair of metal sheet portions sealed to one another peripherally and separated from one another at least at one location inside the periphery so as to form the at least one oil flow passage.

2. A transformer radiator according to claim 1, wherein the pair of metal sheet portions are separate sheets sealed to one another.

3. A transformer radiator according to claim 1, wherein the pair of metal sheet portions are portions of a single sheet folded over one another and sealed to one another.

4. A transformer radiator according to claim 1, wherein the heat exchange fin includes relief formations located in the inner and outermost turns of the fin, wherein the relief formations extend transversely to the manifolds so as to provide the fin with bending resistance and passages for the oil to flow freely.

5. A transformer radiator according to claim 1, wherein each turn of the fin include an inlet connected to the inlet manifold in a sealed manner and an outlet connected to the outlet manifold in a sealed manner.

6. A transformer radiator according to claim 1, wherein each of the inlet and outlet manifolds is in the form of a pipe.

7. A transformer radiator according to claim 1, wherein each of the inlet and outlet manifolds is manufactured from two half-sections that are connected to one another to form the manifold.

8. A method of manufacturing a transformer radiator including:
locating two portions of metal sheeting adjacent one another;
sealing the two portions of metal sheeting peripherally to one another;
deforming the metal sheeting to form a heat exchange fin with a continuously undulating profile formed by alternating bends and straight, parallel turns between the bends;
providing internal pressurization between the two portions of metal sheeting to force them apart from one another at least at one location inside the periphery of the joint sheeting thereby to form the at least one oil flow passage;

providing each turn of the heat exchange fin carrying an oil flow passage with an inlet opening and an outlet opening;

providing an inlet manifold and an outlet manifold;

connecting the inlet openings in a sealed manner to openings in the inlet manifold and connecting the outlet openings in a sealed manner to openings in the outlet manifold.

9. A method according to claim 8, wherein the two portions of metal sheeting are in the form of two separate sheets of metal such that the method includes welding two separate metal sheets to one another.

10. A method according to claim 8, wherein the two portions of metal sheeting are in the form of a folded metal sheet such that the method includes folding a single metal sheet.

\* \* \* \* \*